(12) United States Patent
Jagannathan et al.

(10) Patent No.: US 9,356,121 B2
(45) Date of Patent: May 31, 2016

(54) DIVOT-FREE PLANARIZATION DIELECTRIC LAYER FOR REPLACEMENT GATE

(71) Applicant: International Business Machines Corporation, Armonk, NY (US)

(72) Inventors: Hemanth Jagannathan, Guilderland, NY (US); Sanjay Mehta, Niskayuna, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/486,128

(22) Filed: Sep. 15, 2014

(65) Prior Publication Data

US 2015/0001598 A1 Jan. 1, 2015

Related U.S. Application Data

(62) Division of application No. 13/405,939, filed on Feb. 27, 2012, now abandoned.

(51) Int. Cl.
*H01L 21/3205* (2006.01)
*H01L 21/4763* (2006.01)
*H01L 29/66* (2006.01)
(Continued)

(52) U.S. Cl.
CPC .... *H01L 29/66545* (2013.01); *H01L 21/02172* (2013.01); *H01L 21/31051* (2013.01); *H01L 21/823842* (2013.01);
(Continued)

(58) Field of Classification Search
CPC .............. H01L 29/66545; H01L 29/78; H01L 21/823842; H01L 21/28; H01L 29/6656; H01L 29/6659

USPC ........... 438/585, 587, 591, 295, 197; 257/288
See application file for complete search history.

(56) References Cited

U.S. PATENT DOCUMENTS 5,494,700 A * 2/1996 Anderson et al. ............. 427/115
6,124,640 A 9/2000 Sahota et al.
(Continued)

OTHER PUBLICATIONS

Packan, P. et al., "High Performance 32nm Logic Technology Featuring 2nd Generation High-k + Metal Gate Transistors" 2009 IEEE International Electron Devices Meeting (IEDM) (Dec. 7-9, 2009) pp. 659-662.

(Continued)

*Primary Examiner* — Theresa T Doan
(74) *Attorney, Agent, or Firm* — Scully, Scott, Murphy & Presser, P.C.; Daniel P. Morris, Esq.

(57) ABSTRACT

After formation of a silicon nitride gate spacer and a silicon nitride liner overlying a disposable gate structure, a dielectric material layer is deposited, which includes a dielectric material that is not prone to material loss during subsequent exposure to wet or dry etch chemicals employed to remove disposable gate materials in the disposable gate structure. The dielectric material can be a spin-on dielectric material or can be a dielectric metal oxide material. The dielectric material layer and the silicon nitride liner are planarized to provide a planarized dielectric surface in which the disposable gate materials are physically exposed. Surfaces of the planarized dielectric layer is not recessed relative to surfaces of the silicon nitride layer during removal of the disposable gate materials and prior to formation of replacement gate structures, thereby preventing formation of metallic stringers.

13 Claims, 12 Drawing Sheets

(51) Int. Cl.
*H01L 21/8238* (2006.01)
*H01L 21/02* (2006.01)
*H01L 21/3105* (2006.01)
*H01L 29/423* (2006.01)

(52) U.S. Cl.
CPC ..... *H01L 29/42364* (2013.01); *H01L 29/6656* (2013.01); *H01L 29/6659* (2013.01)

(56) References Cited

U.S. PATENT DOCUMENTS

| | | | |
|---|---|---|---|
| 6,392,280 B1 * | 5/2002 | Besser et al. | 257/410 |
| 7,026,256 B2 | 4/2006 | Sohn | |
| 7,452,766 B2 | 11/2008 | Aritome | |
| 7,768,128 B2 | 8/2010 | Cho et al. | |
| 2007/0228425 A1 | 10/2007 | Miller et al. | |
| 2009/0186458 A1 * | 7/2009 | Yu et al. | 438/233 |
| 2010/0164008 A1 | 7/2010 | Mehrad et al. | |
| 2011/0081774 A1 | 4/2011 | Yeh et al. | |
| 2012/0264281 A1 * | 10/2012 | Chen et al. | 438/591 |
| 2015/0140773 A1 * | 5/2015 | Antonov et al. | 438/381 |

OTHER PUBLICATIONS

Natarajan, S. et al., "A 32nmLogic Technology Featuring 2nd-Generation High-k + Metal-Gate Transistors, Enhanced Channel Strain and 0.171µm2 SRAM Cell Size in a 291Mb Array" 2008 IEEE International Electron Devices Meeting (Dec. 15-17, 2008) 3 pages.

Auth, C. et al., "45nm High-k + Metal Gate Strain-Enhanced Transistors" 2008 Symposium on VLSI Technology (Jun. 2008) pp. 128-129.

Nag, S. et al., "Comparative Evaluation of Gap-Fill Dielectrics in Shallow Trench Isolation for Sub-0.25 µm Technologies" International Electron Devices Meeting (Dec. 1996) pp. 841-845.

* cited by examiner

DIVOT-FREE PLANARIZATION DIELECTRIC LAYER FOR REPLACEMENT GATE

BACKGROUND

The present disclosure relates to semiconductor structures, and particularly to replacement gate semiconductor structures employing a planarization dielectric layer that is planarized without formation of divots or recesses on a top surface thereof, and methods of manufacturing the same.

The use of silicon oxide as gate spacers and/or a planarization dielectric layer results in formation of recesses and divots on the planarized top surfaces of the silicon oxide material. For example, in a semiconductor structure employing a silicon oxide gate spacer and a silicon oxide planarization dielectric layer, removal of a disposable gate material in a replacement gate processing scheme results in collateral etch of the top portions of the silicon oxide gate spacer and top portions of the silicon oxide planarization dielectric layer relative to a top surface of another planarization dielectric material such as silicon nitride. Divots and/or recesses are formed above the top surfaces of the recessed portions of the oxide material.

During deposition of a conductive material for formation of metallic gate structures, such divots and/or recesses are filled with the conductive material. Such residual conductive material filling divots and/or recesses provide a spurious conductive path, causing electrical shorts between various semiconductor devices. Thus, the residual conductive material is a concern for reliability and yield.

SUMMARY

After formation of a silicon nitride gate spacer and a silicon nitride liner overlying a disposable gate structure, a dielectric material layer is deposited, which includes a dielectric material that is not prone to material loss during subsequent exposure to dry or wet etch chemicals employed to remove disposable gate materials in the disposable gate structure. The dielectric material can be a spin-on dielectric material or can be a dielectric metal oxide material. The dielectric material layer and the silicon nitride liner are planarized to provide a planarized dielectric surface in which the disposable gate materials are physically exposed. Surfaces of the planarized dielectric layer is not recessed relative to surfaces of the silicon nitride layer during removal of the disposable gate materials and prior to formation of replacement gate structures, thereby preventing formation of metallic stringers.

According to an aspect of the present disclosure, a method of forming a semiconductor structure is provided, which includes: forming a disposable gate structure including at least a disposable gate material portion on a semiconductor substrate; forming a silicon nitride gate spacer on sidewalls of the disposable gate structure; forming a silicon nitride liner on the silicon nitride gate spacer and over the disposable gate structure; forming a planarization dielectric layer including a dielectric material on the silicon nitride liner; physically exposing a top surface of the disposable gate material portion by planarizing the planarization dielectric layer and the silicon nitride liner; forming a gate cavity by removing at least the disposable gate material portion, wherein all topmost surfaces of the silicon nitride spacer, the silicon nitride liner, and the planarization dielectric layer are within a horizontal plane; and forming a replacement gate structure by filling the gate cavity with a gate dielectric layer and at least one conductive material and removing portions of the gate dielectric layer and the at least one conductive material from above the horizontal plane.

According to another aspect of the present disclosure, a semiconductor structure is provided, which includes a gate-level layer located on a semiconductor substrate and complementarily occupied with at least one gate cavity and dielectric material portions, wherein the dielectric material portions include at least one silicon nitride gate spacer laterally surrounding each of the at least one gate cavity, a silicon nitride liner in contact with all outer surfaces of the at least one silicon nitride gate spacer, and a planarization dielectric layer having one or more portions, wherein each portion of the planarization dielectric layer is embedded within a recessed portion of the silicon nitride liner, and wherein all topmost surfaces of the at least one silicon nitride gate spacer, the silicon nitride liner, and the planarization dielectric layer are within a horizontal plane overlying the semiconductor substrate.

DETAILED DESCRIPTION

Figure 1:
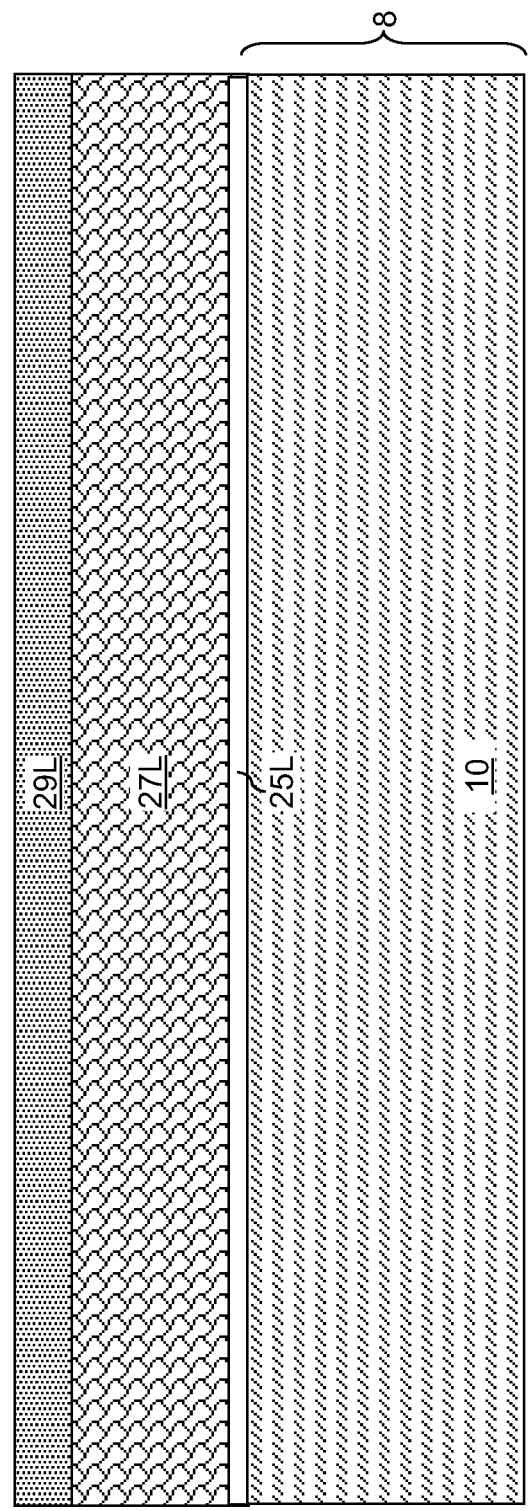
FIG. 1 is a vertical cross-sectional view of a first exemplary semiconductor structure after formation of a disposable dielectric layer, a disposable gate material layer, and an optional disposable gate cap dielectric layer according to a first embodiment of the present disclosure.

As stated above, the present disclosure relates to replacement gate semiconductor structures employing a planarization dielectric layer that is planarized without formation of divots or recesses on a top surface thereof, and methods of manufacturing the same, which are now described in detail with accompanying figures. Like and corresponding elements mentioned herein and illustrated in the drawings are referred to by like reference numerals. The drawings are not necessarily drawn to scale.

Referring to FIG. 1, a first exemplary semiconductor structure according to a first embodiment of the present disclosure includes a semiconductor substrate 8 that includes a semiconductor material layer 10. Various semiconductor devices including at least one field effect transistor can be subsequently formed on the semiconductor material layer 10. The semiconductor substrate 8 can be a bulk substrate including a bulk semiconductor material constituting the semiconductor material layer 10 throughout, or a semiconductor-on-insulator (SOI) substrate (not shown) containing a top semiconductor layer that constitutes a semiconductor material layer, a buried insulator layer (not shown) located under the top semiconductor layer, and a bottom semiconductor layer (not shown) located under the buried insulator layer.

Various portions of the semiconductor material in the semiconductor substrate 8 can be doped with electrical dopants of p-type or n-type at different dopant concentration levels. For example, the semiconductor substrate 8 may include at least one p-type well (not shown) and/or at least one n-type well (not shown). At least one shallow trench isolation structure (not shown) can be formed to laterally separate various surface regions of the semiconductor substrate 8.

A disposable dielectric layer 25L, a disposable gate material layer 27L, and an optional disposable gate cap dielectric layer 29L are deposited on the top surface of the semiconductor substrate 8. The disposable dielectric layer 25L includes a dielectric material such as a semiconductor oxide, a semiconductor nitride, or a semiconductor oxynitride. For example, the disposable dielectric layer 25L can include silicon oxide, silicon nitride, or silicon oxynitride.

The disposable gate material layer 27L includes a material that can be subsequently removed selective to silicon nitride and selective to dielectric materials of gate spacers and a planarization dielectric layer to be subsequently deposited above the top surface of the substrate 8. For example, the disposable gate material layer 27L can include a semiconductor material such as silicon, germanium, a silicon germanium alloy, or a compound semiconductor material. Alternately, the disposable gate material layer 27L can include any dielectric material or any metallic material that can be removed selective to the dielectric materials of the gate spacer and the dielectric layer to be subsequently deposited.

Optionally, a disposable gate cap dielectric layer 29L can be deposited on the disposable gate material layer. The disposable gate cap dielectric layer 29L includes a dielectric material such as silicon nitride. The total thickness of the stack of the disposable dielectric layer 25L, the disposable gate material layer 27L, and the optional disposable gate cap dielectric layer 29L can be from 50 nm to 500 nm, although lesser and greater thicknesses can also be employed.

Figure 2:
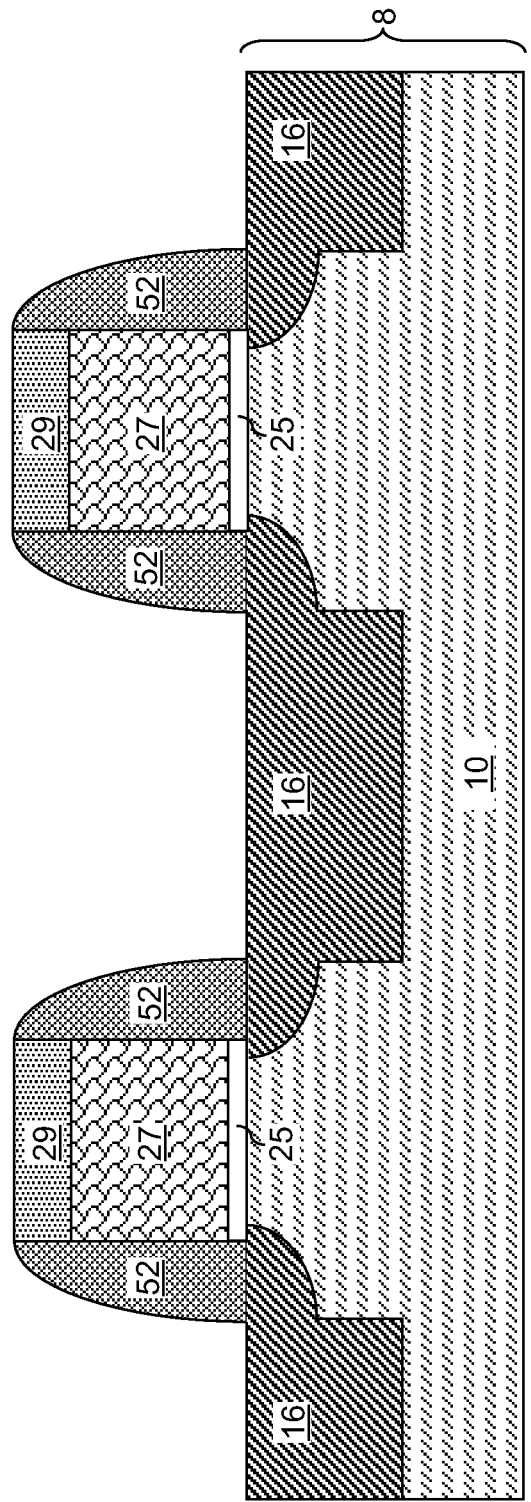
FIG. 2 is vertical cross-sectional view of the first exemplary semiconductor structure after formation of disposable gate structures and silicon nitride gate spacers according to the first embodiment of the present disclosure.

Referring to FIG. 2, the stack of the disposable dielectric layer 25L, the disposable gate material layer 27L, and the optional disposable gate cap dielectric layer 29L is subsequently lithographically patterned to form disposable gate structures. Each disposable gate structure includes a disposable dielectric portion 25, which is a remaining portion of the disposable dielectric layer 25L, and a disposable gate material portion 27, which is a remaining portion of the disposable gate material layer 27L. Each disposable gate structure may optionally include a disposable gate cap dielectric portion 29, which is a remaining portion of the disposable gate cap dielectric layer 29L. In one embodiment, the disposable gate dielectrics 25 can include at least one of silicon oxide and silicon oxynitride and/or the disposable gate material portions 27 can include a semiconductor material.

Silicon nitride gate spacers 52 are formed on sidewalls of each of the disposable gate structures (25, 27, 29), for example, by deposition of a conformal dielectric material layer and an anisotropic etch. Silicon nitride can be deposited, for example, by chemical vapor deposition (CVD) or atomic layer deposition (ALD).

Masked ion implantation can be performed before and/or after formation of the silicon nitride gate spacers 52. A masking structure including a combination of a patterned photoresist layer (not shown) and at least one disposable gate structure (25, 27, 29) is employed for each masked ion implantation prior to formation of the gate spacers 52. A masking structure including a combination of a patterned photoresist layer (not shown) and at least one disposable gate structure (25, 27, 29) and at least one silicon nitride gate spacer 52 laterally surrounding each of the at least one disposable gate structure (25, 27, 29) is employed for each masked ion implantation after formation of the gate spacers 52. Multiple patterned photoresists can be employed in combination with multiple ion implantation steps to form various source and drain regions 16, i.e., source regions and drain regions, having different dopant types and/or different dopant concentrations. As used herein, source and drain regions 16 include any source region, any drain region, any source extension region, or any drain extension region as known in the art.

In one embodiment, the disposable gate material portions 27 include a semiconductor material, and the silicon nitride gate spacers 52 are formed directly on sidewalls of the semiconductor material in the disposable gate structures 27.

In one embodiment, the disposable gate structures (25, 27, 29) can employ materials other than semiconductor oxide and semiconductor oxynitride. In this case, semiconductor oxide or semiconductor oxynitride is not present above the bottom surface of the disposable gate material portions 27 after the forming of the disposable gate structures (25, 27, 29).

Figure 3:
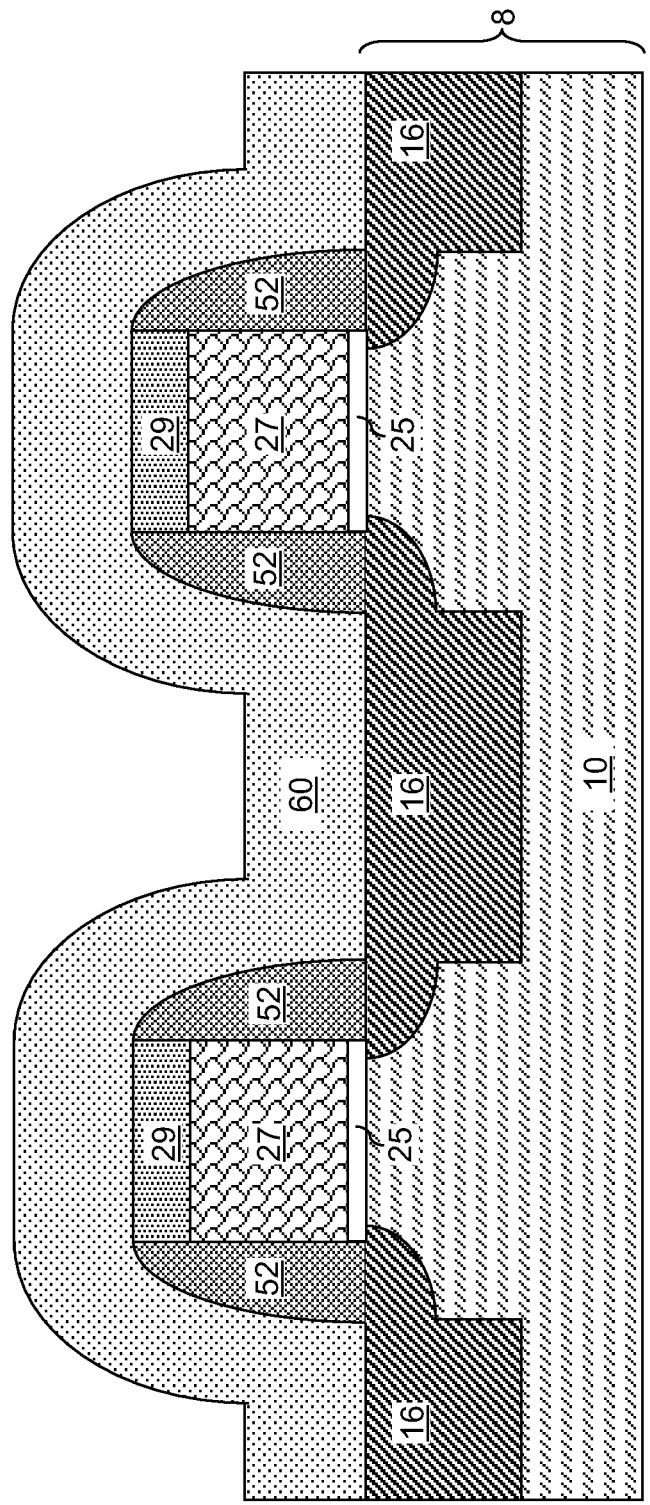
FIG. 3 is vertical cross-sectional view of the first exemplary semiconductor structure after formation of a silicon nitride liner according to the first embodiment of the present disclosure.

Referring to FIG. 3, a silicon nitride liner 60 is deposited on the silicon nitride gate spacers 52 and over the disposable gate structures (25, 27, 29). The silicon nitride liner 60 is a contiguous layer that contacts the entirety of outer sidewall surfaces of the silicon nitride gate spacers 52, the entirety of top surfaces of the disposable gate structures (25, 27, 29), and the entirety of the top surface of the semiconductor substrate 8 that is not contacted by the silicon nitride gate spacers 52 or the disposable gate structures (25, 27, 29). The silicon nitride liner 60 can be deposited, for example, by chemical vapor deposition (CVD). The thickness of the silicon nitride liner 60 can be from 20 nm to 200 nm, although lesser and greater thicknesses can also be employed.

Figure 4:
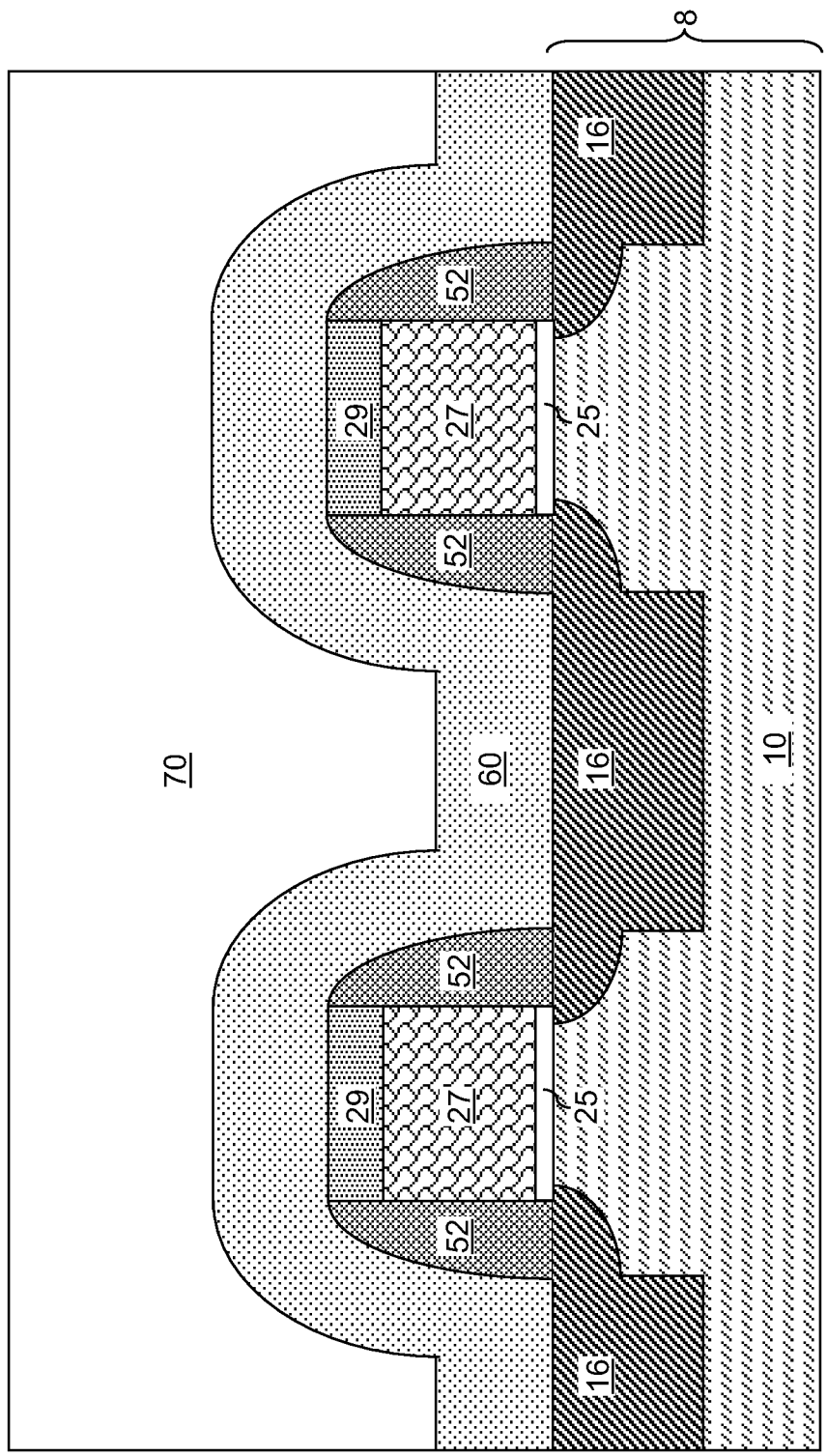
FIG. 4 is a vertical cross-sectional view of the first exemplary semiconductor structure after formation of a planarization dielectric layer including a spin-on dielectric material according to the first embodiment of the present disclosure.

Referring to FIG. 4, a planarization dielectric layer 70 is formed above the silicon nitride liner 60. The planarization dielectric layer 70 includes a dielectric material other than semiconductor oxide, silicon nitride, and semiconductor oxynitride. If the disposable gate structures (25, 27, 29) can employ materials other than semiconductor oxide and semiconductor oxynitride, no semiconductor oxide or semiconductor oxynitride is present above the plane of the top surface of the disposable gate dielectrics 25.

The planarization dielectric layer 70 including a spin-on dielectric material that is etch-resistant to hydrofluoric acid, i.e., a spin-on dielectric material that is not etched by hydrofluoric acid. The spin-on dielectric material of the planarization dielectric layer 70 can be applied by spin-coating, and is self-planarizing, i.e., forms a planar top surface without application of external force other than gravity. Exemplary spin-on dielectric materials include hydrogen silsesquioxane (HSQ) and methyl silsesquioxane (MSQ). The thickness of the planarization dielectric layer 70 as measured from above the topmost portions of the silicon nitride liner 60 can be from 20 nm to 300 nm, although lesser and greater thicknesses can also be employed.

Figure 5:
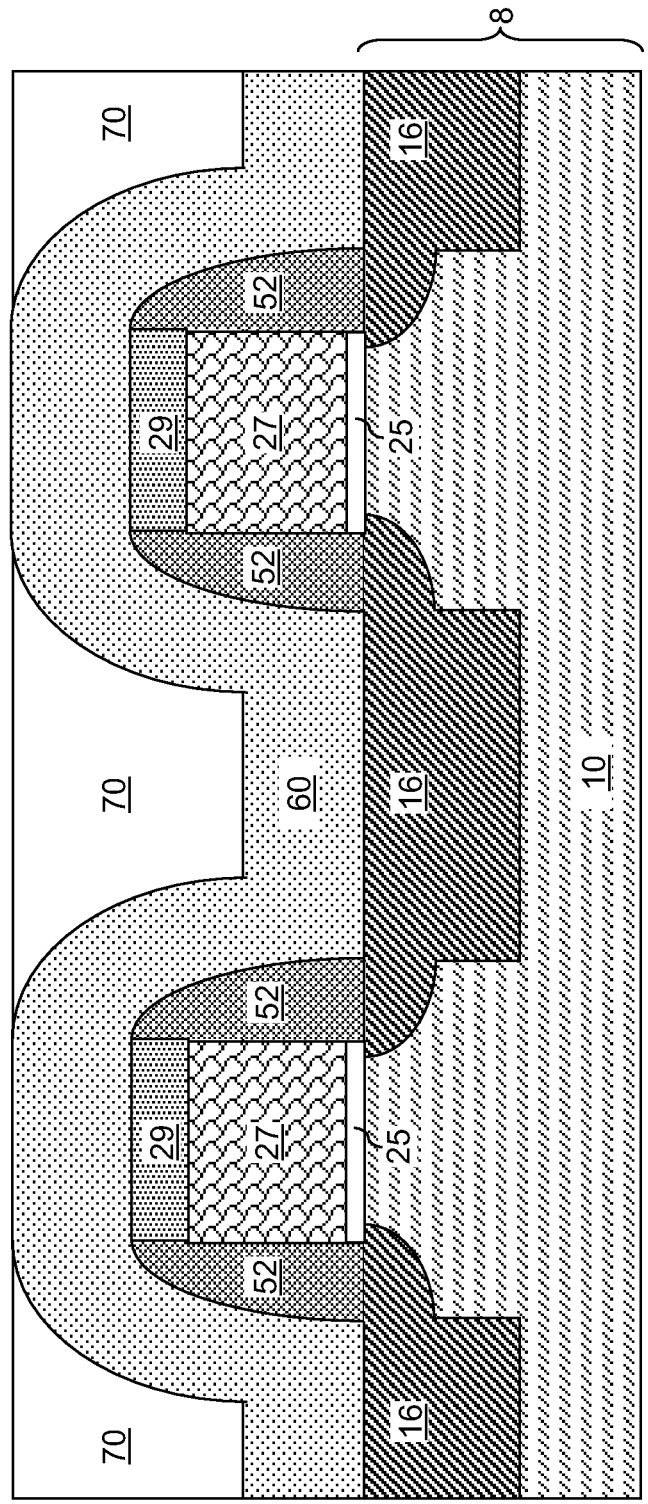
FIG. 5 is a vertical cross-sectional view of the first exemplary semiconductor structure after planarization of the planarization dielectric layer to a topmost surface of the silicon nitride liner according to the first embodiment of the present disclosure.

Referring to FIG. 5, the planarization dielectric layer 70 is planarized to a topmost surface of the silicon nitride liner 60. The planarization of the planarization dielectric layer 70 can be effected, for example, by a recess etch or chemical mechanical planarization (CMP). The top surface of the silicon nitride liner 60 can be employed as a stopping layer for the recess etch or for CMP.

Figure 6:
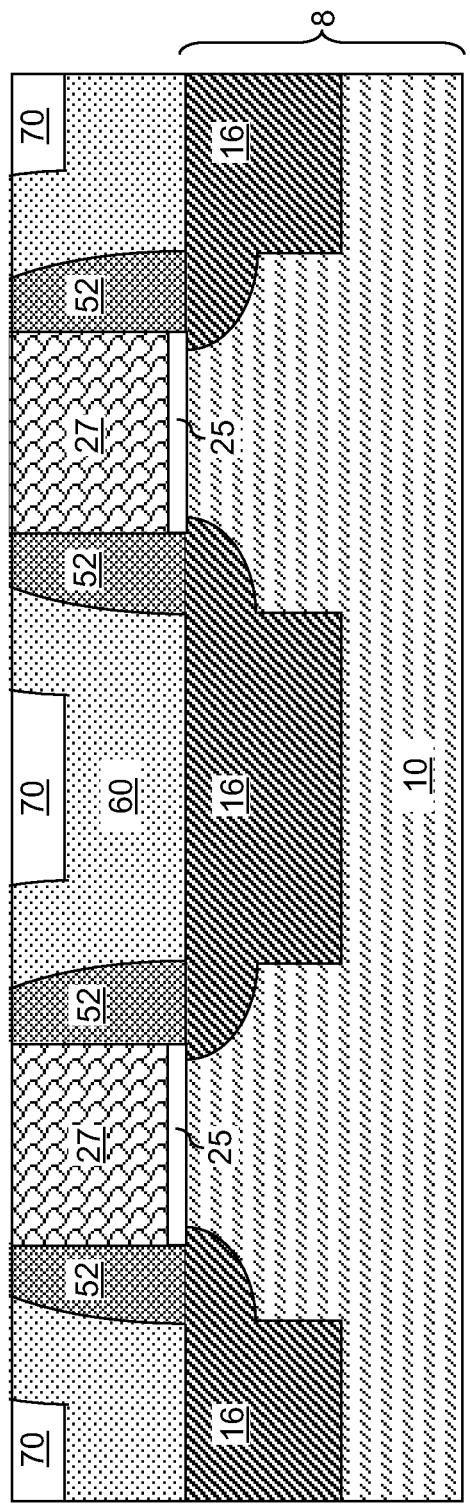
FIG. 6 is a vertical cross-sectional view of the first exemplary semiconductor structure after planarization of the planarization dielectric layer, silicon nitride liner, and gate cap dielectric portions according to the first embodiment of the present disclosure.

Referring to FIG. 6. the planarization dielectric layer 70, the silicon nitride liner 60, and the disposable gate cap dielectric portions 29, if present, are planarized, for example, by chemical mechanical planarization or a non-selective recess etch, to a level at which a top surface of the disposable gate material portions 27 are physically exposed. The physically exposed top surface of the disposable gate material portions 27 may be located at, or below, the topmost surfaces of the disposable gate material portions 27 prior to the planarization of the planarization dielectric layer 70, the silicon nitride liner 60, and the disposable gate cap dielectric portions 29.

Figure 7:
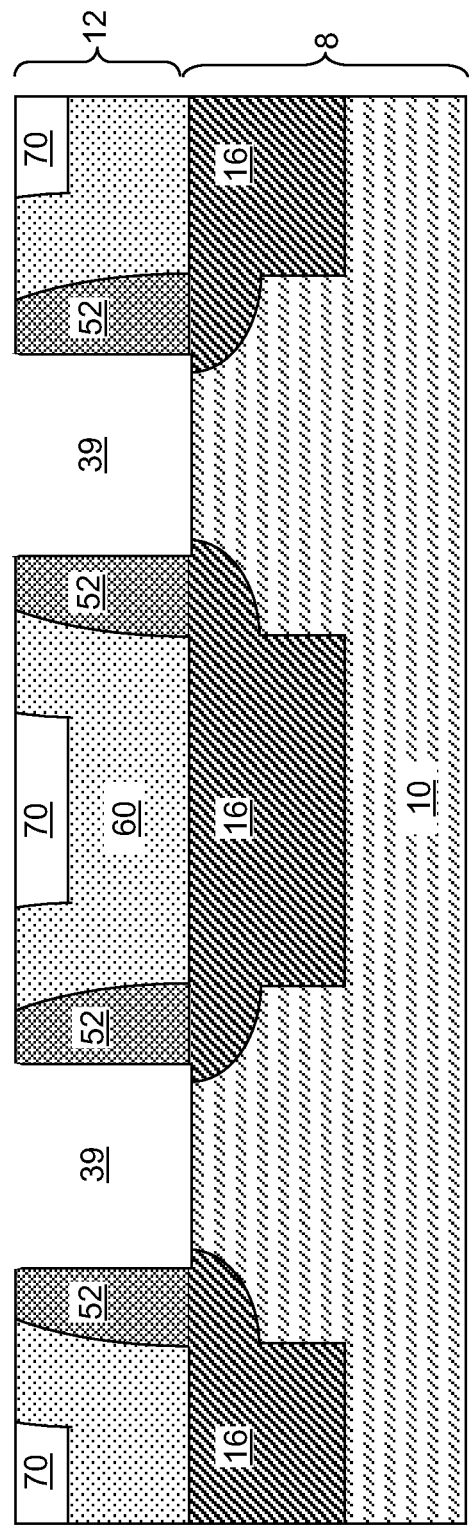
FIG. 7 is a vertical cross-sectional view of the first exemplary semiconductor structure after removal of the disposable gate structures according to the first embodiment of the present disclosure.

Referring to FIG. 7, the remaining portions of the disposable gate structures (25, 27) are removed selective to the materials of the planarization dielectric layer 70, the silicon nitride liner 60, and the silicon nitride gate spacers 52. A gate cavity 39 is formed within each volume from which a disposable gate structure (25, 27) is removed.

The formation of the gate cavities 39 can be effected by at least one etch that does not remove any material from the silicon nitride liner 60, the silicon nitride gate spacer 52, or the planarization dielectric layer 70, while removing an entirety of the disposable gate structures (25, 27). A semiconductor surface of the semiconductor substrate 8 is physically exposed at the bottom of each gate cavity 39. In one embodiment, the at least one etch can be at least one wet etch that employs hydrofluoric acid (HF) and/or ammonium hydroxide (NH$_4$OH). Silicon nitride or the dielectric material of the planarization dielectric layer 70 is not removed during the formation of the gate cavities 39. Thus, all topmost surfaces of the silicon nitride spacers 52, the silicon nitride liner 60, and the planarization dielectric layer 70 are within a horizontal plane that is parallel to the topmost surface of the semiconductor substrate 8. Inner sidewall surfaces of each silicon nitride gate spacer 52 are physically exposed within a gate cavity 39.

The first exemplary semiconductor structure includes a gate-level layer 12 located on the semiconductor substrate. The gate-level layer 12 is complementarily occupied with at least one gate cavity 39 and dielectric material portions. In other words, the gate-level layer 12 consists of the at least one gate cavity 39 and the dielectric material portions. The dielectric material portions include at least one silicon nitride gate spacer 52 laterally surrounding each of the at least one gate cavity 39, the silicon nitride liner 60 in contact with all outer surfaces of the at least one silicon nitride gate spacer 52, and the planarization dielectric layer 70 having one or more portions, i.e., in the form of a single contiguous portion or in the form of a plurality of non-contiguous portions that are laterally spaced by at least one of the silicon nitride liner 60 and one or more silicon nitride gate spacers 52. Each portion of the planarization dielectric layer 70 is embedded within a recessed portion of the silicon nitride liner 60, and is laterally contacted by upper portions of the silicon nitride liner 60. All topmost surfaces of the at least one silicon nitride gate spacer 52, the silicon nitride liner 60, and the planarization dielectric layer 70 are within a horizontal plane overlying the semiconductor substrate 8 and parallel to the top surface of the semiconductor substrate 8.

Semiconductor oxide or semiconductor oxynitride is not present above the horizontal plane of the bottommost surface of the at least one gate cavity 39, which coincides with the top surface of the semiconductor substrate 8. As discussed above, the planarization dielectric layer 70 includes a spin-on dielectric material such as hydrogen silsesquioxane (HSQ) or methyl silsesquioxane (MSQ).

Each of the at least one gate cavity 39 can overlie a channel of a field effect transistor that includes the various portions of the source and drain regions 16 as the source and the drain of the field effect transistor. In one embodiment, the dielectric material portions can consist of the at least one silicon nitride gate spacer 52, the silicon nitride liner 60, and the planarization dielectric layer 70.

Figure 8:
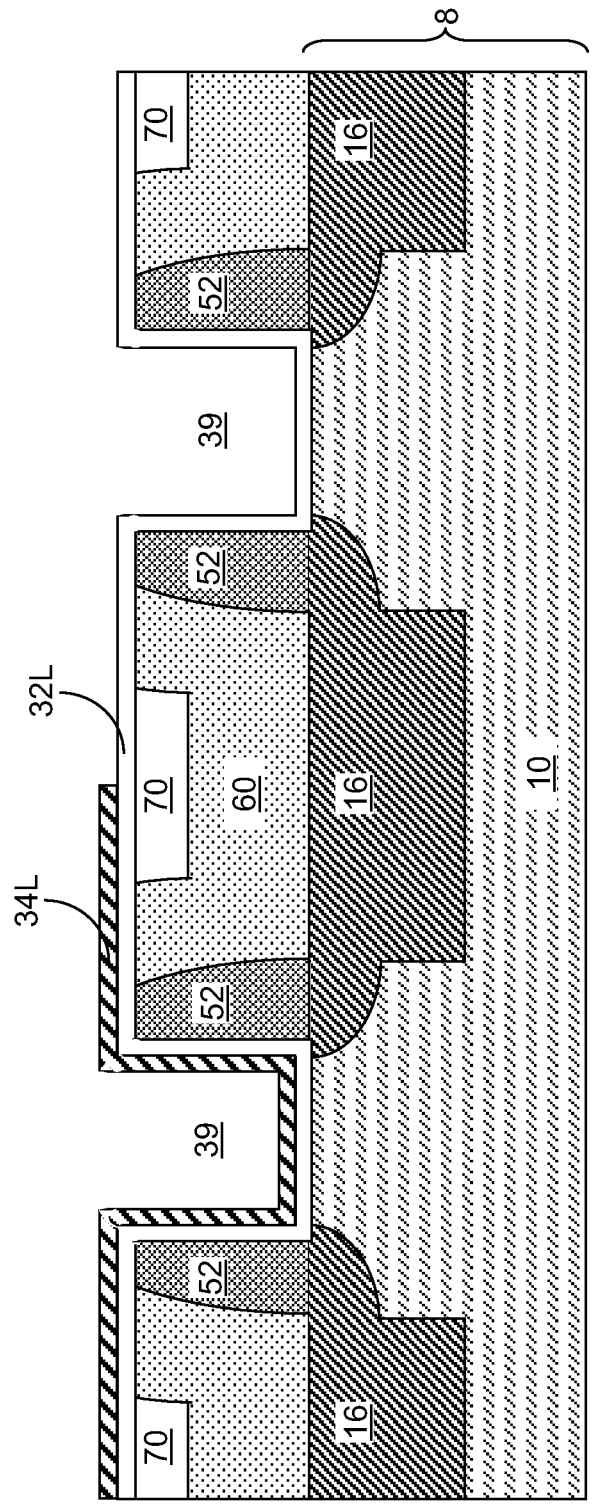
FIG. 8 is a vertical cross-sectional view of the first exemplary semiconductor structure after deposition of a contiguous gate dielectric layer and a first work function metallic layer and patterning of the first work function metallic layer according to the first embodiment of the present disclosure.

Referring to FIG. 8, a contiguous gate dielectric layer 32L is deposited in the gate cavities 39 and over the top surfaces of the silicon nitride gate spacers 52, the silicon nitride liners 60, and the planarization dielectric layer 70. The contiguous gate dielectric layer 32L can be a high dielectric constant (high-k) material layer having a dielectric constant greater than 3.9. The contiguous gate dielectric layer 32L can include a dielectric metal oxide, which is a high-k material containing a metal and oxygen, and is known in the art as high-k gate dielectric materials. Dielectric metal oxides can be deposited by, for example, chemical vapor deposition (CVD), physical vapor deposition (PVD), molecular beam deposition (MBD), pulsed laser deposition (PLD), liquid source misted chemical deposition (LSMCD), atomic layer deposition (ALD), etc. Exemplary high-k dielectric material include $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, a silicate thereof, and an alloy thereof. Each value of x is independently from 0.5 to 3 and each value of y is independently from 0 to 2. The thickness of the contiguous gate dielectric layer 32L, as measured at horizontal portions, can be from 0.9 nm to 6 nm, and preferably from 1.0 nm to 3 nm. The contiguous gate dielectric layer 32L may have an effective oxide thickness on the order of or less than 2 nm. The entirety of the interface between the contiguous dielectric layer 32L and the horizontal surfaces of the silicon nitride gate spacers 52, the silicon nitride liners 60, and the planarization dielectric layer 70 is planar. In one embodiment, an optional interfacial dielectric material layer (not shown) can be formed at the interface layer between the contiguous gate dielectric layer 32L and the semiconductor material layer 10. The interfacial dielectric material layer can include, for example, silicon oxide and/or silicon oxynitride.

A first work function metallic layer 34L is deposited on the contiguous gate dielectric layer 32L, and is lithographically patterned to be present with at least one gate cavity 39, while being absent within at least another gate cavity 39. The first work function metallic layer 34L includes a metallic material that can optimize the threshold voltages of transistors. For example, the first work function metallic layer 34L can include metallic materials such as Pt, Rh, Ir, Ru, Cu, Os, Be, Co, Pd, Te, Cr, Ni, TiN, Hf, Ti, Zr, Cd, La, Tl, Yb, Al, Ce, Eu, Li, Pb, Tb, Bi, In, Lu, Nb, Sm, V, Zr, Ga, Mg, Gd, Y, and TiAl, conductive nitrides thereof, and alloys thereof. The first work function metallic layer 34L can be formed, for example, by physical vapor deposition, chemical vapor deposition, or atomic layer deposition (ALD). The thickness of the first work function metallic layer 34L can be from 2 nm to 40 nm, although lesser and greater thicknesses can also be employed.

Figure 9:
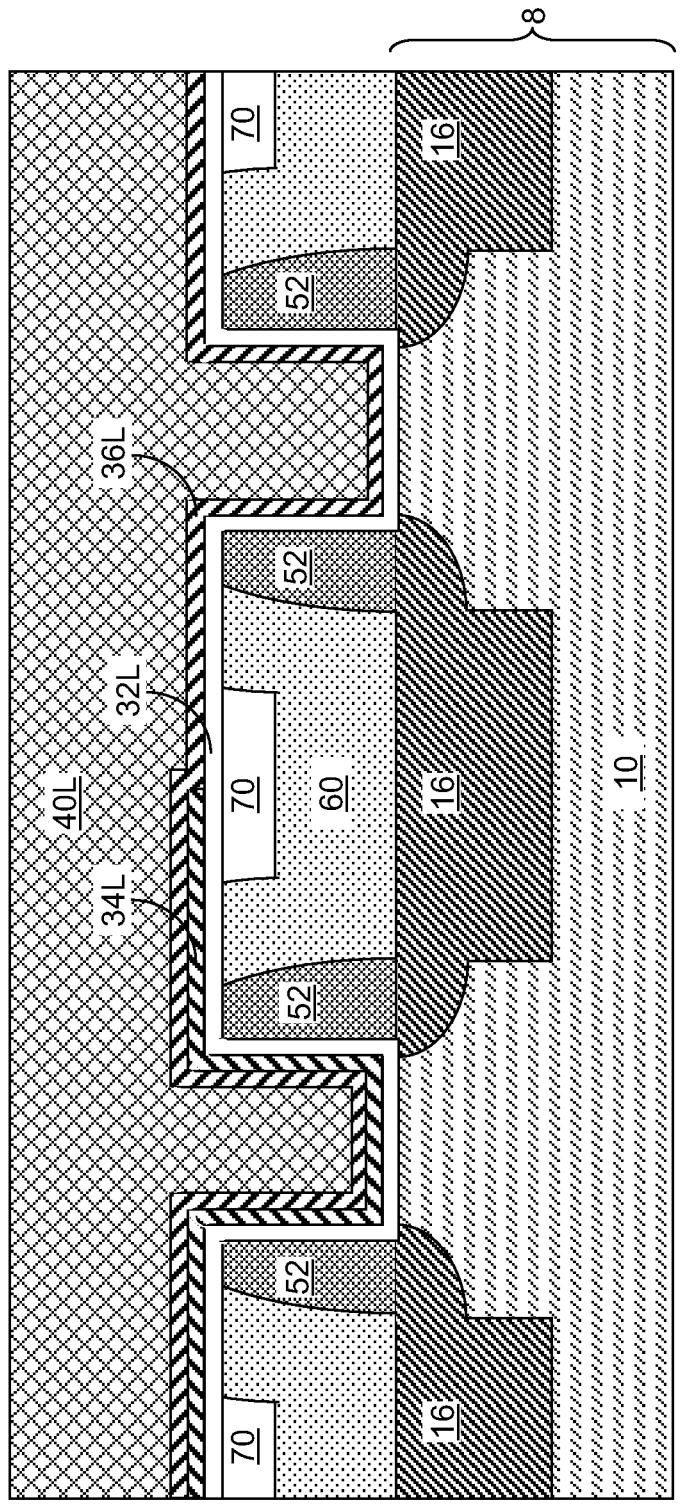
FIG. 9 is a vertical cross-sectional view of the first exemplary semiconductor structure after deposition of a second work function metallic layer and a gate conductor layer according to the first embodiment of the present disclosure.

Referring to FIG. 9, a second work function metallic layer 36L is deposited on the physically exposed surfaces of the first work function metallic layer 34L and the contiguous gate dielectric layer 32L. The second work function metallic layer 36L includes a metallic material that can optimize the threshold voltages of transistors. The metallic material of the second work function metallic layer 36L can be different from the metallic material of the first work function metallic layer 34L. For example, the second work function metallic layer 36L can include any metallic material that can be selected for the metallic material of the first work function metallic layer 34L. The second work function metallic layer 36L can be formed, for example, by physical vapor deposition, chemical vapor deposition, or atomic layer deposition (ALD). The thickness of the second work function metallic layer 36L can be from 2 nm to 40 nm, although lesser and greater thicknesses can also be employed.

A gate conductor layer 40L is deposited over the first and second work function metallic layers (34L, 36L). The gate conductor layer 40L includes a conductive material, which can be deposited by physical vapor deposition or chemical vapor deposition. For example, the gate conductor layer 40L can be an aluminum layer, an aluminum alloy layer, a tungsten layer, and/or a tungsten alloy layer deposited by physical vapor deposition. The thickness of the gate conductor layer 40L, as measured in a planar region of the conductive metal layer 40L above the topmost surface of the second work function metallic layer 36L, can be from 100 nm to 500 nm, although lesser and greater thicknesses can also be employed. In one embodiment, the gate conductor layer 40L can include a single elemental metal such as Al or W or alloys thereof.

Figure 10:
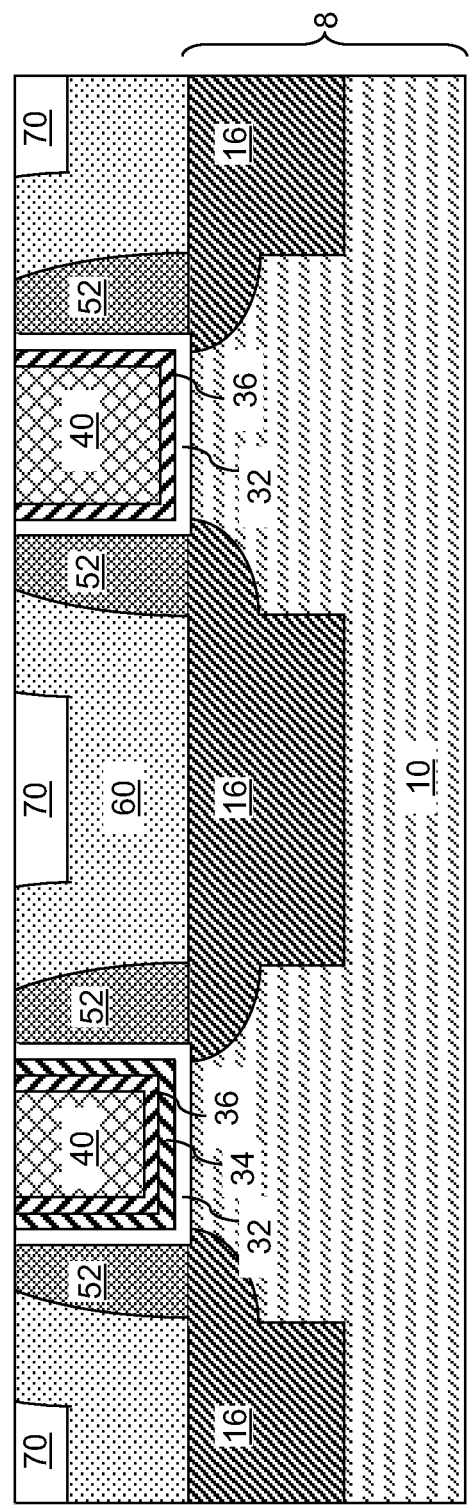
FIG. 10 is a vertical cross-sectional view of the first exemplary semiconductor structure after formation of replacement gate structures according to the first embodiment of the present disclosure.

Referring to FIG. 10, portions of the gate conductor layer 40L, portions of the first and second work function metallic layers (34L, 36L), and portions the contiguous gate dielectric layer 32L are removed from above the top planar surface of the planarization dielectric layer 70 by performing a planarization process such as chemical mechanical planarization (CMP) and/or a non-selective recess etch. Replacement gate structures are formed within volumes that are previously occupied by disposable gate structures (25, 27, 29; See FIGS. 2-6). Each replacement gate structure is a gate stack that remains permanently on the semiconductor substrate 8, i.e., is not disposable.

A gate dielectric 32, at least one work function metal portion (34, 36), and a gate conductor 40 are present with each replacement gate structure. Each gate dielectric 32 is a remaining portion of the contiguous gate dielectric layer 32L after the planarization process. As discussed above, an optional interfacial dielectric material layer (not shown) can be present at the interface layer between the contiguous gate dielectric layer 32L and the semiconductor material layer 10. Each first work function metal portion 34 is a remaining portion of the first work function metallic layer 34L after the planarization process. Each second work function metal portion 36 is a remaining portion of the second work function metallic layer 36L after the planarization process. Each gate conductor 40 is a remaining portion of the gate conductor layer 40L after the planarization process. Each replacement gate structure (32, optionally 34, 36, 40) can overlie a channel region of a field effect transistor. A stack of at least one work function metal portion (36 and optionally 34) and a gate conductor 40 constitutes a gate electrode (36, optionally 34, 40).

Each gate dielectric 32 can be a U-shaped gate dielectric contacting the semiconductor material of the semiconductor material layer 10 and the inner surfaces of a silicon nitride gate spacer 52. Because the gate dielectrics 32 include the same material as the contiguous gate dielectric layer 32L (See FIGS. 8 and 9), the gate dielectrics 32 can be U-shaped gate dielectrics including a dielectric material having a dielectric constant greater than 3.9. The U-shaped gate dielectrics include vertical portions, which have top surfaces that are coplanar with the top surfaces of the silicon nitride spacer 52, the silicon nitride liner 60, and the planarization dielectric layer 70.

Each work function metal portion (34, 36) can be a U-shaped work function metal portion. A work function metal portion (34, 36) may contact inner surfaces of the vertical portions of the gate dielectrics 32 and the top surfaces of the horizontal portions of the gate dielectrics 32. Alternately, a second work function metal portion 36 may contact inner sidewalls of vertical portions of a first work function metal portion 34 and a top surface of a horizontal portion of the first work function metal portion 34. Each U-shaped work function metal portion includes vertical portions, which have top surfaces that are coplanar with the top surfaces of the silicon nitride spacer 52, the silicon nitride liner 60, and the planarization dielectric layer 70 and the top surfaces of the vertical portions of the U-shaped gate dielectrics.

Each gate conductor 40 has a top surface that is coplanar with the top surface of the silicon nitride spacer 52, the silicon nitride liner 60, and the planarization dielectric layer 70, and with the top surfaces of the vertical portions of the U-shaped gate dielectrics, and with the top surfaces of the vertical portions of the U-shaped work function metal portions.

Thus, each replacement gate structure (32, optionally 34, 36, 40) can be formed by filling a gate cavity 39 with a contiguous gate dielectric layer 32L and at least one conductive material, and removing portions of the contiguous gate dielectric layer 32L and the at least one conductive material from above a horizontal plane that is located at, or below, a plane including top surfaces of the top surfaces of the silicon nitride spacer 52, the silicon nitride liner 60, and the planarization dielectric layer 70. The replacement gate structure (32, optionally 34, 36, 40) includes a U-shaped gate dielectric, i.e., a gate dielectric 32, which is in contact with inner sidewalls of a silicon nitride gate spacer 52. The replacement gate structure (32, optionally 34, 36, 40) further includes a gate electrode, which includes at least one conductive material, i.e., the conductive materials of a second work function metal portion 36, the conductive material of the gate conductor 40, and optionally the conductive material of a first work function metal portion 34. The gate electrode (36, 40, and optionally 34) is in contact with inner sidewalls of the U-shaped gate dielectric.

Figure 11:
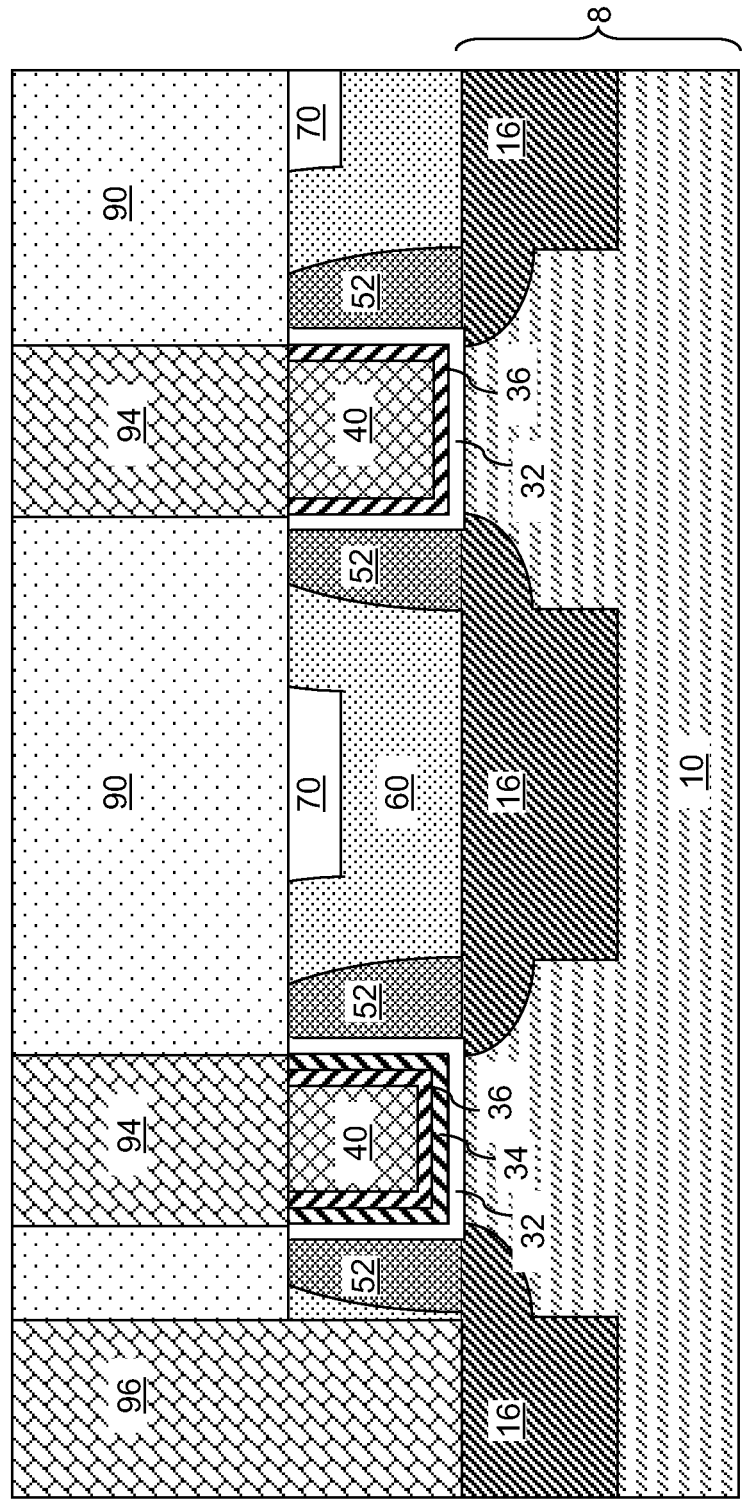
FIG. 11 is a vertical cross-sectional view of the first exemplary semiconductor structure after formation of a contact-level dielectric layer and various contact structures according to the first embodiment of the present disclosure.

Referring to FIG. 11, a contact-level dielectric layer 90 and various contact structures (94, 96) are formed. The contact-level dielectric layer 90 is deposited on a planar horizontal surface of the replacement gate structures (32, 34, 36, 40), the silicon nitride spacers 52, the silicon nitride liner 60, and the planarization dielectric layer 70, as a blanket layer, i.e., a layer without a pattern. The contact-level dielectric layer 90 includes a dielectric material such as silicon oxide, silicon nitride, and/or porous or non-porous organosilicate glass. The contact-level dielectric layer 90 can be deposited, for example, by chemical vapor deposition (CVD) or spin coating. The thickness of the contact-level dielectric layer 90 can be from 30 nm to 600 nm, although lesser and greater thicknesses can also be employed.

Various contact via holes are formed through the contact-level dielectric layer 90, for example, by applying and patterning a photoresist (not shown), and transferring the pattern in the photoresist into through the contact-level dielectric layer 90 and optionally through a stack of the planarization dielectric layer 70 and the silicon nitride liner 60. The various contact via holes are filled with a conductive material to form various contact via structures, which can include at least one gate-contact via structure 94 and at least one substrate-contact via structure 96.

Figure 12:
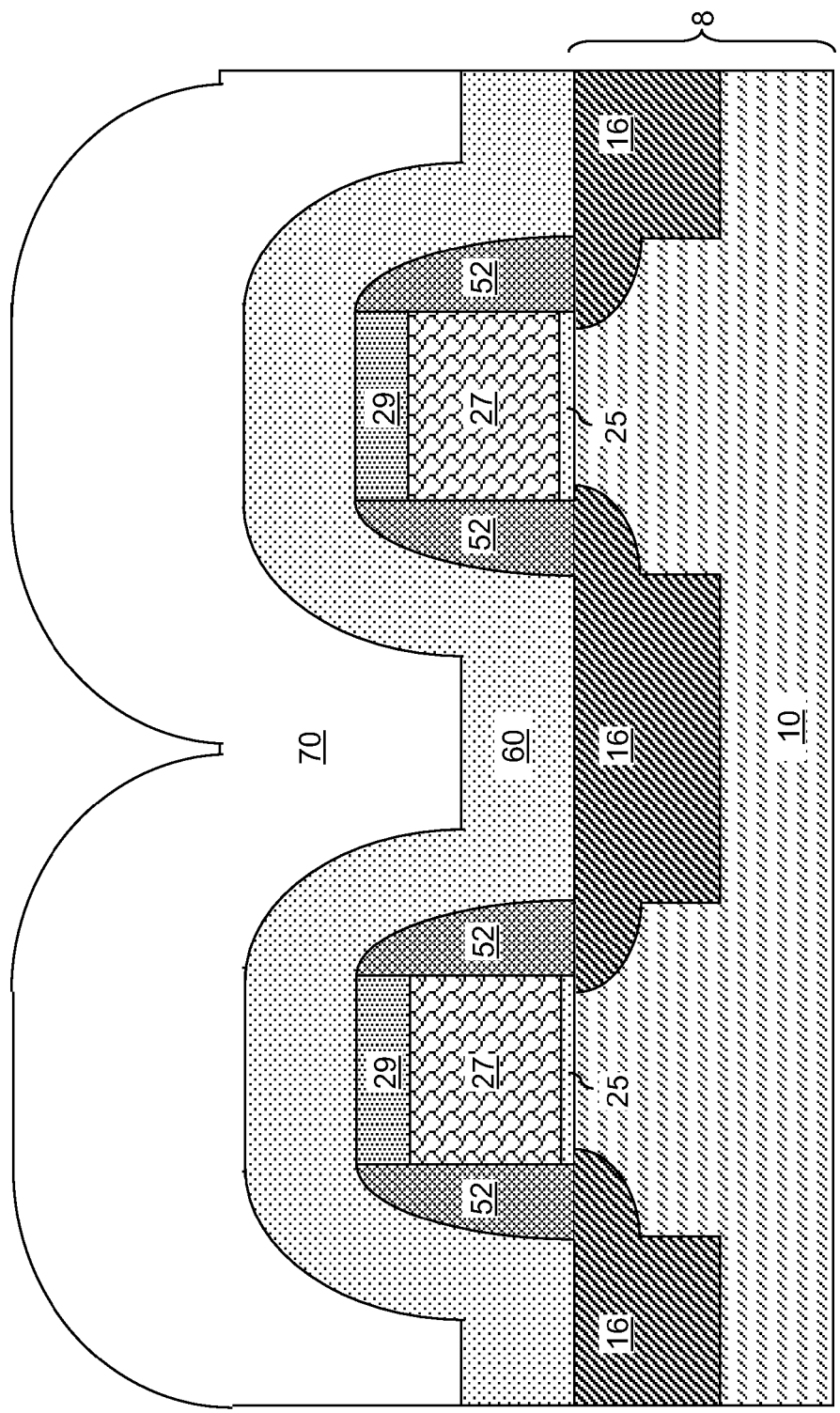
FIG. 12 is a vertical cross-sectional view of a second exemplary semiconductor structure after formation of planarization dielectric layer including a dielectric metal oxide material according to a second embodiment of the present disclosure.

Referring to FIG. 12, a second exemplary semiconductor structure according to a second embodiment of the present disclosure can be derived from the first exemplary semiconductor structure of FIG. 3 by formation of planarization dielectric layer 70 that is not self-planarized. The planarization dielectric layer 70 includes a dielectric material other than semiconductor oxide, silicon nitride, and semiconductor oxynitride. Thus, a semiconductor oxide or a semiconductor oxynitride is not present above the plane of the top surface of the disposable gate dielectrics 25 at this processing step.

The planarization dielectric layer 70 including a dielectric material that is etch-resistant to hydrofluoric acid and/or ammonium hydroxide, i.e., a dielectric material that is not etched by the etchant to be subsequently employed. The dielectric material of the planarization dielectric layer 70 can be deposited by, for example, chemical vapor deposition (CVD), physical vapor deposition (PVD), molecular beam deposition (MBD), pulsed laser deposition (PLD), liquid source misted chemical deposition (LSMCD), atomic layer deposition (ALD), etc. The dielectric material of the planarization dielectric layer 70 can be formed by a conformal deposition process, i.e., a deposition process that forms a film having a same thickness on a vertical surface as on a horizontal surface. Exemplary dielectric materials that can be employed for the planarization dielectric layer 70 include dielectric metal oxides such as $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, a silicate thereof, and an alloy thereof. Each value of x is independently from 0.5 to 3 and each value of y is independently from 0 to 2. The thickness of the planarization dielectric layer 70 as measured from above the topmost portions of the silicon nitride liner 60 can be from 20 nm to 300 nm, although lesser and greater thicknesses can also be employed.

The dielectric material of the planarization dielectric layer 70 is deposited as an amorphous material. The second exemplary semiconductor structure is subsequently annealed at an elevated temperature to crystallize the amorphous material of the planarization dielectric layer 70. The amorphous material of the planarization dielectric layer 70 as deposited is converted into a polycrystalline dielectric metal oxide during the anneal. The temperature of the anneal can be from 700 degrees Celsius to 1,100 degrees Celsius. In one embodiment, the temperature of the anneal can be greater than 800 degrees Celsius. In one embodiment, the temperature of the anneal can be greater than 900 degrees Celsius. In one embodiment, the temperature of the anneal can be greater than 1,000 degrees Celsius. In one embodiment, the temperature of the anneal can be less than 1,000 degrees Celsius. In one embodiment, the temperature of the anneal can be less than 900 degrees Celsius. In one embodiment, the temperature of the anneal can be less than 800 degrees Celsius. The duration of the anneal at the elevated temperature can be from 1 second to 24 hours, although lesser and greater durations can also be employed.

The entirety of the planarization dielectric layer 70 includes a polycrystalline dielectric metal oxide material after the anneal. The average grain size of the polycrystalline dielectric metal oxide material in the planarization dielectric layer 70 after the anneal can be metal oxide material in the planarization dielectric layer 70 can be in a range from 3 nm to 100 nm, although lesser and greater average grain sizes can also be employed. As used herein, an "average grain size" refers to the average lateral dimensions in a random cross-sectional view such as a transmission electron micrographs (TEMs).

The processing steps of FIGS. 6-11 are subsequently as in the first embodiment to provide a structure that is the same as the first exemplary structure of FIG. 11 except for the differences in the composition of the planarization dielectric layer 70. Because the planarization dielectric layer 70 includes a polycrystalline dielectric metal oxide instead of an amorphous dielectric metal oxide, the planarization dielectric layer 70 provides greater etch resistance to chemicals employed to remove the disposable gate structures (25, 26; See FIG. 6) during the at least one etch that forms the at least one gate cavity 39 at the processing step of FIG. 7. As in the first embodiment, silicon nitride or the dielectric material of the planarization dielectric layer 70 is not removed during the formation of the gate cavities 39 at the processing step of FIG. 7 because the polycrystalline dielectric metal oxide of the planarization dielectric layer 70 is resistant to most etch chemicals including hydrofluoric acid. Thus, all topmost surfaces of the silicon nitride spacers 52, the silicon nitride liner 60, and the planarization dielectric layer 70 are within a horizontal plane that is parallel to the topmost surface of the semiconductor substrate 8 after formation of gate cavities 39 (See FIG. 7).

While the disclosure has been described in terms of specific embodiments, it is evident in view of the foregoing description that numerous alternatives, modifications and variations will be apparent to those skilled in the art. Each of the various embodiments of the present disclosure can be implemented alone, or in combination with any other embodiments of the present disclosure unless expressly disclosed otherwise or otherwise impossible as would be known to one of ordinary skill in the art. Accordingly, the disclosure is intended to encompass all such alternatives, modifications and variations which fall within the scope and spirit of the disclosure and the following claims.

What is claimed is:

1. A method of forming a semiconductor structure comprising:

forming a disposable gate structure comprising at least a disposable gate material portion on a semiconductor substrate;

forming a silicon nitride gate spacer on sidewalls of said disposable gate structure;

forming a silicon nitride liner on said silicon nitride gate spacer and over said disposable gate structure;

forming a planarization dielectric layer comprising an amorphous metal oxide on said silicon nitride liner;

annealing said planarization dielectric layer to convert said amorphous metal oxide into a polycrystalline metal oxide;

physically exposing a topmost surface of said disposable gate structure by planarizing said planarization dielectric layer and said silicon nitride liner;

forming a gate cavity by removing said disposable gate structure, wherein topmost surfaces of said silicon nitride spacer, said silicon nitride liner, and said planarization dielectric layer are within a horizontal plane, and wherein said forming said gate cavity is affected by at least one wet etch that employs at least one of hydrofluoric acid and ammonium hydroxide, and said topmost surface of said planarization dielectric layer is bare during said at least one etch; and forming a replacement gate structure within said gate cavity.

2. The method of claim 1, wherein said at least one etch does not remove any material from said silicon nitride liner or said planarization dielectric layer, while removing an entirety of said disposable gate structure.

3. The method of claim 1, further comprising planarizing, said planarization dielectric layer employing a top surface of said silicon nitride liner as a stopping layer prior to said physically exposing said topmost surface of said disposable gate structure.

4. The method of claim 1, wherein said disposable gate material portion comprises a semiconductor material, and said silicon nitride gate spacer is formed directly on sidewalls of said semiconductor material in said disposable gate structure.

5. The method of claim 1, wherein said planarization dielectric layer comprises $HfO_2$, $ZrO_2$, $La_2O_3$, $Al_2O_3$, $TlO_2$, $SrTiO_3$, $LaAlO_3$, $Y2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, a silicate thereof, or an alloy thereof.

6. The method of claim 1, wherein said polycrystalline metal oxide has an average grain size in a range from 3 nm to 100 nm.

7. The method of claim 1, wherein said planarization dielectric layer is formed by chemical vapor deposition (CVD) or atomic layer deposition (ALD)).

8. The method of claim 1, wherein said annealing said planarization dielectric layer is performed at a temperature ranging from 700° C to 1100° C.

9. The method of claim 1, wherein said annealing said planarization dielectric layer is performed for a time period ranging from 1 s to 24 h.

10. The method of claim 1, wherein said disposable gate structure further comprises a disposable gate dielectric underlying said disposable gate material portion.

11. The method of claim 10, wherein said disposable gate dielectric comprise silicon oxide or silicon oxynitride.

12. The method of claim 10, wherein said disposable gate structure further comprises a disposable gate cap atop said disposable gage material portion.

13. The method of claim 1, wherein formation of said replacement gate structure comprises:

forming a gate dielectric layer on a bottom surface and sidewalls of said gate cavity and over said topmost surfaces of said silicon nitride spacer, said silicon nitride liner, and said planarization dielectric layer;

depositing at least one conductive material over said gate dielectric layer; and removing portions of said gate dielectric layer and said at least one conductive material from above said horizontal plane.

* * * * *